(12) United States Patent
Fischer

(10) Patent No.: US 6,466,510 B2
(45) Date of Patent: Oct. 15, 2002

(54) 1-OUT-OF-N DECODER CIRCUIT

(75) Inventor: Helmut Fischer, Taufkirchen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/962,410

(22) Filed: Sep. 24, 2001

(65) Prior Publication Data

US 2002/0036945 A1 Mar. 28, 2002

(30) Foreign Application Priority Data

Sep. 23, 2000 (DE) .......................................... 100 47 251

(51) Int. Cl.[7] ................................................ G11C 8/00
(52) U.S. Cl. ............................ 365/230.06; 365/230.05; 365/189.02
(58) Field of Search ....................... 365/230.06, 230.05, 365/189.02

(56) References Cited

U.S. PATENT DOCUMENTS

| | | | |
|---|---|---|---|
| 4,578,779 A | * 3/1986 | Chan et al. | 365/190 |
| 4,818,900 A | 4/1989 | Klaus et al. | 307/450 |
| 6,219,298 B1 | 4/2001 | Hur et al. | 365/230.06 |
| 6,243,318 B1 | * 6/2001 | Yoshihara | 365/230.06 |
| 6,385,123 B1 | * 5/2002 | Dietrich et al. | 365/230.06 |

FOREIGN PATENT DOCUMENTS

DE   199 27 878 A1   8/2000

* cited by examiner

*Primary Examiner*—Hoai Ho
*Assistant Examiner*—Tu-Tu Ho
(74) *Attorney, Agent, or Firm*—Laurence A. Greenberg; Werner H. Stemer; Gregory L. Mayback

(57) ABSTRACT

A decoder circuit for driving a selected one from a set of N output lines on the basis of an M-bit address and in response to a turn-on signal contains $K \geq 2$ parallel input decoders, each of which decodes an associated segment of the M-bit address by activating precisely one of its outputs. An output decoder contains, for each of the N output lines, a separate drive path having a group of K controllable switches in series between the output line in question and a drive potential. Each switch group in the output decoder can be turned on by precisely one associated subset of the input decoder outputs which contains precisely one output from each input decoder. Connected to the outputs of one of the input decoders is a device which responds to the turn-on signal in order to enable these outputs for coupling to the associated switches in the drive paths only during the appearance of the turn-on signal.

6 Claims, 2 Drawing Sheets

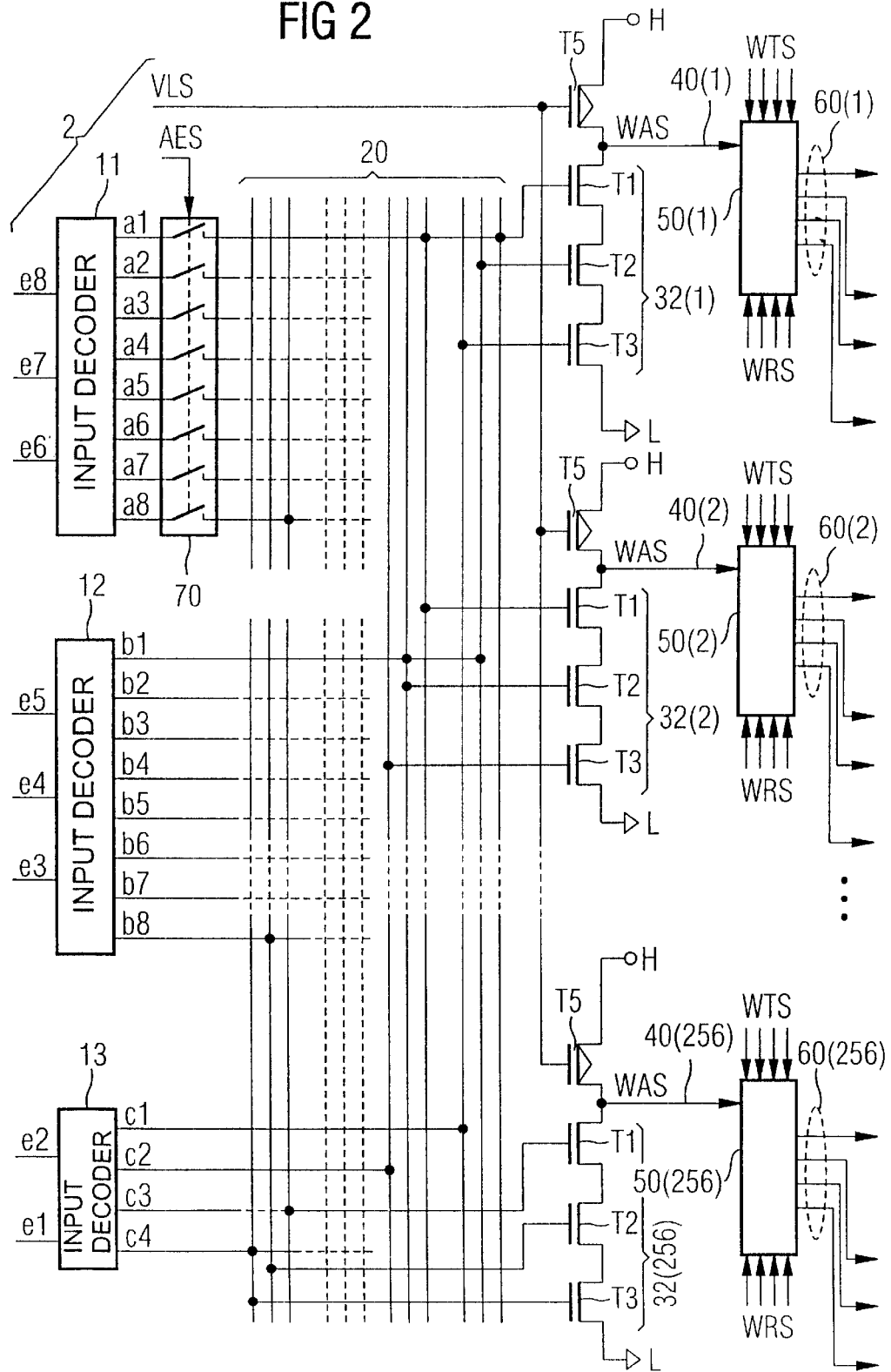

1-OUT-OF-N DECODER CIRCUIT

BACKGROUND OF THE INVENTION

Field of the Invention

The invention relates to a decoder circuit for driving a selected instance from a set of N output lines on the basis of an M-bit address and in response to a turn-on signal. The decoder circuit of this type includes: a number $K \geq 2$ of parallel input decoders, each of which receives an associated segment of the M-bit address and, for each bit pattern to be expected for this segment, activates precisely one instance of its outputs which is uniquely associated with this bit pattern; an output decoder which contains, for each of the N output lines, a separate drive path having a plurality of controllable switches whose switching paths are arranged in series between the output line in question and a drive potential; a coupling network for coupling each of the N different subsets of the input decoder outputs, which respectively contain one output of each of the K input decoders, to the control connections of K instances of the controllable switches in one instance of the N drive paths which is associated with the subset in question, such that these switches turn on when those instances of the input decoder outputs which are coupled to them have been activated.

The drive paths are connected through only during the appearance of a turn-on signal.

Such 1-out-of-N decoders are known in general and they are conventionally used to address row and column selection lines on a matrix of memory cells. This is also the preferred field of application of the present invention.

If the number N of output lines to be selectively driven is relatively high, such as in the case of addressing in a memory matrix, the 1-out-of-N decoding is usually performed in sub steps. In this context, the M-bit address is split into K segments, where the number $m_k$ of bits in the individual segments may be the same or different. For the K address segments, a group of K parallel 1-out-of-$m_k$ input decoders is used, each of which receives the bits of a segment associated with it and, for each bit pattern to be expected for this segment, activates precisely one instance of its $m_k$ outputs which is associated with this bit pattern. Hence, in the full set of all the input decoder outputs, only a subset is ever activated, which comprises precisely K outputs, a respective one from each input decoder. In total, there are N such subsets, corresponding to the N possible bit combinations which can be expected in the M-bit address for addressing the N output lines. The M-bit address received on the input decoders thus determines which of the subsets of input decoder outputs is activated.

For further decoding of the address and for driving the respectively addressed output line, each of the N subsets of the input decoder outputs mentioned is connected to K control inputs of an individually associated combinational logic circuit in an output decoder. Accordingly, the output decoder contains N such combinational logic circuits, a respective one for each of the N output lines. In known address decoders, as are customary in connection with memory matrices, for example, each of these combinational logic circuits comprises a drive path containing K+1 switches in series. This drive path is arranged between the output line in question and a potential source supplying the electric "drive potential" to which the output lines are to be connected in the driven state. The control connections of K instances of these switches in each drive path form the control inputs connected to the K associated input decoder outputs. Each of these K switches is connected (i.e. on) only when the input decoder output connected to its control connection has been activated. The control connection of the (K+1)th switch is connected for receiving the turn-on signal; this switch is on only during the active state of the turn-on signal.

In some applications of a multistage 1-out-of-N decoder system containing K input decoders and an output decoder, only limited space is available for each of the N drive paths in the output decoder. This is true particularly if the system is used as an address decoder for selecting word lines or word line groups or else bit lines in a memory matrix and is integrated on the same chip as the matrix. In this case, for layout reasons, it is usually imperative for the individual drive paths of the output decoder, e.g. for the word lines, to be arranged such that their longitudinal extent firstly runs transversely with respect to the direction of the word lines and secondly does not exceed a particular measure. This measure depends on the distance between the individual word lines and on how many word lines are associated with each of the N output lines or with each of the drive paths of the output decoder. The closer the word lines are arranged next to one another, the less space is ultimately available for the longitudinal extent of a drive path. This space has to accommodate the series of switches contained in the drive path.

This space requirement creates problems, particularly when, as is usual, the K+1 switches in each drive path are in the form of field effect transistors (FETs), in particular MOS-type transistors (MOSFETs), whose channels form the switching paths and whose gates form the control electrodes. For a field effect transistor to turn off reliably, the channel between the source and the drain needs to have a certain minimum length. This sets a lower limit for the total length of the drive path and hence a lower limit for the distance between the word lines. This, of course, conflicts with the desire for increasing miniaturization of memory chips.

It is therefore desirable to optimize the field effect transistors used in this context such that the ratio of their channel length to their total dimension is as high as possible. It is known that, during photolithographic fabrication of field effect transistors, there is a tendency for the charge carriers implanted in the source and drain zones after they have been formed to diffuse into the adjacent region of the channel zone during subsequent high-temperature processing steps, and hence to reduce the effective length of the channel. This disadvantageous effect can be eliminated by following application of the gate oxide with implantation of charge carriers of opposite conduction type into the border regions between the channel on the one hand and the source and drain on the other. Since these boundary regions are covered by the gate oxide, they can only be hit if implantation is carried out from a very oblique direction under the lateral edge of the gate oxide. This measure is known as "halo implantation" and is also customary when fabricating switching transistors for the drive paths in the output decoder of word line addressing circuits.

On an integrated series circuit having a plurality of field effect transistors, optimizing halo implantation can be performed effectively only if the transistors are at a certain minimum distance from one another. This is because, with a very close arrangement, the gaps between the gate oxide regions of adjacent transistors are too narrow to allow unimpeded oblique irradiation of the implant material under the lateral edges of the gate oxide. The desired and inherently advantageous halo implantation thus sets a new limit for miniaturization.

The problems described above are just a few of the more prevalent and important examples of the drawbacks of the prior art multistage 1-out-of-N decoder circuits.

SUMMARY OF THE INVENTION

It is accordingly an object of the invention to provide a decoder circuit, which overcomes the above-mentioned disadvantages of the heretofore-known devices and methods of this general type and which is designed such that the space required for the drive paths in the output decoder can be used more advantageously than previously. It is a particular object of the invention to allow the interspace between the switches in each drive path to be made larger than previously without needing to increase the size of the space for the total length of the drive path.

With the foregoing and other objects in view there is provided, in accordance with the invention, a decoder circuit for driving a selected instance of a set of N output lines on the basis of an M-bit address and in response to a turn-on signal, the decoder circuit comprising:

a number $K \geq 2$ of parallel input decoders having a plurality of inputs together receiving an M-bit address, a plurality of input decoder outputs, and each receiving a respectively associated segment of the M-bit address and, for each bit pattern to be expected for the segment, activating precisely one instance of the outputs uniquely associated with the bit pattern;

an output decoder having, for each of the N output lines, a separate drive path with a plurality of controllable switches having switching paths in series between the respective output line and a drive potential;

a coupling network for coupling each of N different subsets of the input decoder outputs, which respectively contain one output of each of the K input decoders, to the control connections of K instances of the controllable switches in one instance of the N drive paths associated with the subset in question, such that the switches turn on when those instances of the input decoder outputs coupled thereto have been activated; and a combinational logic device connected to all the outputs of one of the input decoders and having an input receiving a turn-on signal and configured to permit the drive paths to be connected through only when the turn-on signal appears, whereby the combinational logic device responds to the turn-on signal by enabling the outputs to be coupled to the control connections of the switches associated with the outputs in the drive paths only during the appearance of the turn-on signal.

In accordance with an added feature of the invention, the decoder circuit is commonly integrated with a memory matrix on a semiconductor chip and forms an address decoder for addressing N subsets of a plurality of mutually parallel selection lines in the memory matrix. Each of the output lines is connected to the connection device for an associated subset of the selection lines, and a series circuit comprising the switches is arranged, along a length thereof, in each drive path transversely with respect to the selection lines in the memory matrix.

In accordance with an additional feature of the invention, the switches in each drive path are field effect transistors having channels forming the switching paths and gate electrodes forming the control connections.

In accordance with another feature of the invention, the field effect transistors forming the switches in the drive paths are optimized by halo implants at respective ends of the channels thereof.

In accordance with a concomitant feature of the invention, each of the output lines is connected to the connection device for an associated subset of the word lines in the memory matrix.

In other words, a decoder circuit for driving a selected instance from a set of N output lines on the basis of an M-bit address and in response to a turn-on signal has a number $K \geq 2$ of parallel input decoders, each of which receives an associated segment of the M-bit address and, for each bit pattern to be expected for this segment, activates precisely one instance of its outputs which is uniquely associated with this bit pattern. An output decoder contains, for each of the N output lines, a separate drive path having a plurality of controllable switches whose switching paths are arranged in series between the output line in question and a drive potential. A coupling network is used for coupling each of the N different subsets of the input decoder outputs, which respectively contain precisely one output of each of the K input decoders, to the control connections of K instances of the controllable switches in one instance of the N drive paths which is associated with the subset in question, such that these switches turn on when those instances of the input decoder outputs which are coupled to them have been activated. Finally, a combinational logic device is provided which permits the drive paths to be connected fully only during the appearance of the turn-on signal. According to the invention, the combinational logic device is a device which is connected to all the outputs of one of the input decoders and responds to the turn-on signal in order to enable these outputs for coupling to the control connections of the switches associated with said outputs in the drive paths only during the appearance of the turn-on signal.

The object of the invention is thus to provide the means for logically combining the decoding with the turn-on signal not in the drive paths of the output decoder, as previously, but rather to move these means to the input decoder level. This is not difficult because it suffices to disable the outputs of only one of the K input decoders in order to prevent each of the N drive paths in the output decoder from being connected fully. Thus, at most, only as many individual logic combinations with the turn-on signal are required as there are outputs on the input decoder in question. This number is at most equal to $2^m$, if m is the number of bits in the associated segment of the input address. By contrast, in the prior art, where the logic combination with the turn-on signal was performed in the drive paths themselves, $N=2^M$ individual logic combinations were required, if M is the number of bits of the full address and all the bit combinations of the full address are used as the effective address (as is for the most part desirable and usual). By virtue of the invention, a large number of combinational logic elements are thus obviated, which is an advantage in itself.

The advantage relates not only to the number of combinational logic elements obviated, however, but also, in particular, to the locations at which they are obviated, namely the locations of the drive paths in the output decoder. By virtue of the invention, one switch fewer than in the prior art is required in each drive path. The space available for each drive path on a chip thus needs to be shared by fewer switches than previously. The space can therefore be better utilized for the channel length of the field effect transistors used as switches and/or for the distance between adjacent transistors. The latter point, in particular, improves the conditions for the success of obliquely directed halo implantation. The degree of miniaturization can therefore be increased beyond the level which has been possible to date.

Other features which are considered as characteristic for the invention are set forth in the appended claims.

Although the invention is illustrated and described herein as embodied in a 1-out-of-N decoder circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a circuit diagram of a 1-out-of-N decoder circuit according to the invention.

DESCRIPTION OF THE PREFERRED EMBODIMENTS

Figure 1:
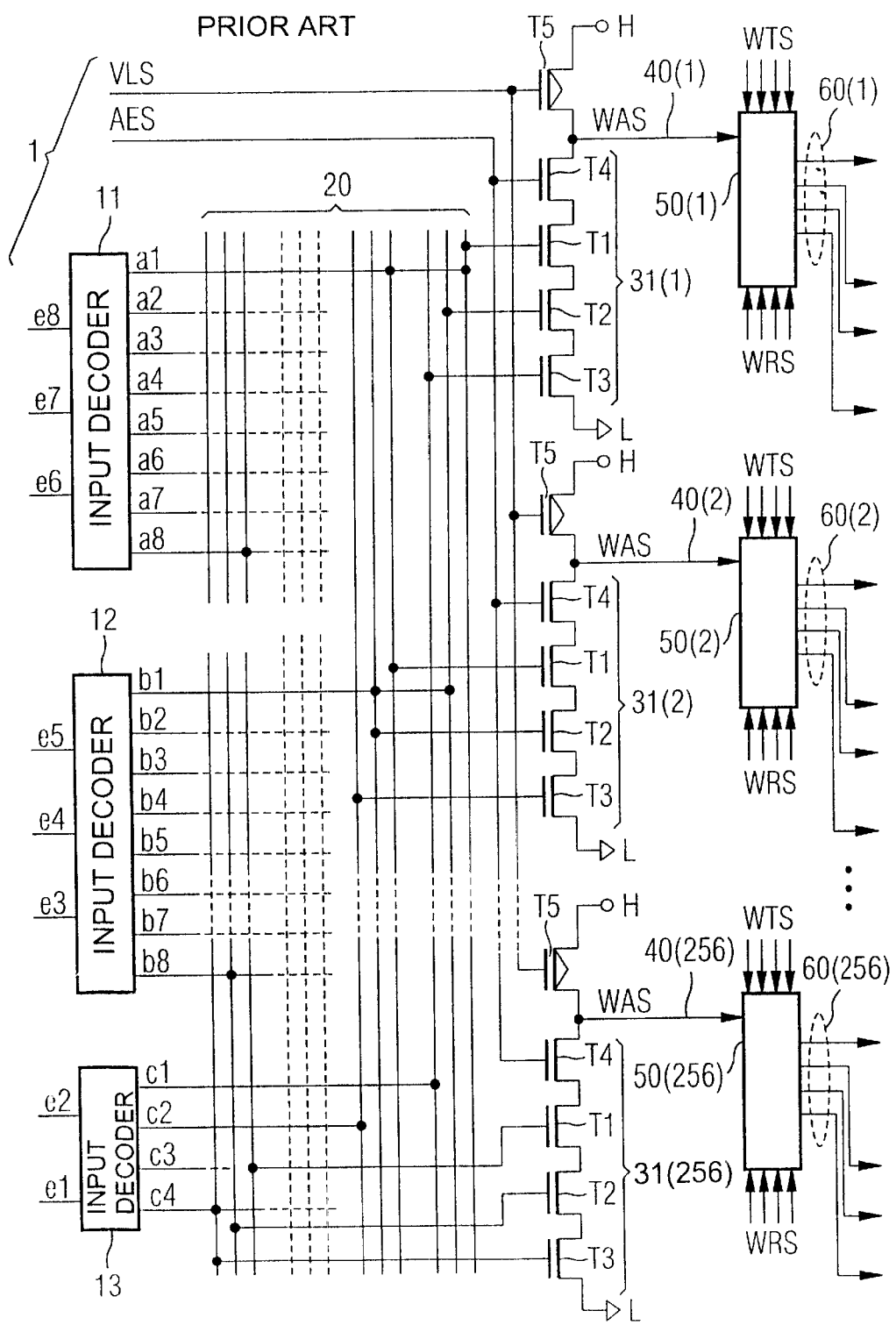
FIG. 1 is a circuit schematic of a 1-out-of-N decoder circuit based on the prior art.

Referring now to the figures of the drawing in detail, the decoder circuits 1 and 2 shown therein are examples which are specifically configured to select N word line groups 60 in a memory matrix individually. The word line groups 60 are disjunct subsets of the full set of word lines in the memory matrix. In the exemplary illustration shown here, each word line group 60 comprises four word lines connected to four outputs of a connection device 50 which is individually associated with the group in question. Each connection device 50 has an input for receiving a word line group selection signal WAS, four inputs for word line driver signals WTS and four inputs for word line reset signals WRS. In the case shown, a word line group 60 is selected precisely when the selection signal WAS applied to the connection device 50 in question is at low level (L level, binary value "0"). In this situation, a word line in this group is driven to activation potential (H level, binary value "1") when the instance of the four driver signals WTS which is associated with that activation potential appears at H level, and is reset to deactivation potential (L level) when the instance of the four reset signals WRS which is associated with said deactivation potential appears at H level.

The selection signals WAS for selectively driving the N different connection devices 50 are produced by a 1-out-of-N decoder circuit on output lines 40, on the basis of an M-bit address which contains enough bits to deliver N different bit patterns. A typical known embodiment of such a decoder circuit will first be described below with reference to FIG. 1.

The exemplary embodiment of a known decoder circuit 1 shown schematically in FIG. 1 forms an address decoder for $N=2^8=256$ word line four-element groups 60(1) to 60(256) in a non-illustrated memory matrix containing a total of 1024 word lines. Accordingly, the decoder circuit 1 has 256 output lines 40(1) to 40(256), of which only the first two instances 40(1), 40(2) and the last instance 40(256) are shown. Each output line 40 is routed to the WAS input of an individually associated instance of the N=256 connection devices 50(1) to 50(256).

The decoder circuit 1 has $M=\log_2 N=8$ address inputs e1 to e8 for applying the 8 bits of an 8-bit address. The inputs e6, e7 and e8 for the three most significant bits (MSBs) of the address are routed to a first 1-out-of-8 input decoder 11 which has 8 outputs a1 to a8 and, for each of the 8 possible combinations of its three input bits, respectively activates only a single instance of these outputs, which is uniquely associated with the bit combination in question, by putting this output to H level.

In a similar way, the inputs e3, e4 and e5 for the three next less significant bits of the address are routed to a 1-out-of-8 input decoder 12 which has 8 outputs b1 to b8 and, for each of the 8 possible combinations of its three input bits, respectively activates only a single instance of these outputs, which is uniquely associated with the bit combination in question, by putting this output to H level.

The inputs e1 and e2 for the two least significant bits (LSBs) of the address are routed to a 1-out-of-4 input decoder 13 which has 4 outputs c1 to c4 and, for each of the 4 possible combinations of its two input bits, respectively activates only a single instance of these outputs, which is uniquely associated with the bit combination in question, by putting this output to H level.

During operation, when any address is applied to the 8 address inputs e1 to e8, precisely one output on each of the input decoders 11, 12, 13 is thus always at H level. The other outputs remain at L level. Put another way, any bit pattern on the eight address inputs always activates precisely three input decoder outputs: one from the a group a1 to a8 from the first input decoder 11, one from the b group b1 to b8 from the second input decoder 12, and one from the c group c1 to c4 from the third input decoder 13. There are a total of 4·8·8=256 such three-element combinations of activated input decoder outputs. Each of these three-element combinations is one of the 256 possible subsets respectively containing precisely one output of each of the three input decoders and is uniquely determined by the bit pattern of the input address.

A network 20 comprising a large number of lines connects each of the afore-mentioned 256 different subsets of the input decoder outputs to a respective separate instance of 256 drive circuits which, for their part, are connected to the 256 output lines 40 of the decoder circuit 1. Each drive circuit contains, for the output line 40 in question, a drive path 31 containing four switches arranged in series between a source for L potential and the output line 40 in question. In the case shown, the four switches are in the form of N-channel field effect transistors (N-FETs) T1 to T4. A fifth field effect transistor T5 with a P-channel field effect transistor (P-FET) can be used to connect any output line 40 to a source for H potential.

Specifically, the network 20 connects the first output a1 of the first input decoder 11 to the gate electrode of the first N-FET T1 in the drive path 31(1) of the first output line 40(1), connects the first output b1 of the second input decoder 12 to the gate electrode of the second N-FET T2 of this drive path, and connects the first output c1 of the third input decoder 13 to the gate electrode of the third N-FET T3 of the same drive path. The gate electrodes of the three N-FETs T1, T2, T3 of the drive path 31(2) of the second output line 40(2) are connected to the first output a1 of the first input decoder 11, to the first output b1 of the second input decoder 12 and to the second output c2 of the third input decoder 13. In a correspondingly continued permutation, the three respective N-FETs T1, T2, T3 in the drive paths of the other output lines are connected to the outputs of the three input decoders 11, 12, 13, with another of the 256 three-element combinations of a, b and c input decoder outputs being connected to the gate electrodes of the three FETs T1, T2, T3 in each drive path. FIG. 1 shows, by way of example, only the drive path 31(256) of the last output line 40(256), the N FETs T1, T2, T3 of which are controlled by the last output a8 or b8 or c4, respectively, of the three input decoders 11, 12, 13.

This connection layout means that any pattern of input address bits has only one uniquely associated instance of the drive paths 31, in which instance all three N-FETs T1, T2, T3 are connected (turned on) by H levels from the input decoders 11, 12, 13. Hence, unique 1-out-of-256 selection of the drive paths 31 is effected on the basis of the input address. However, the associated output line is meant to be actually driven only when a special drive turn-on signal AES appears. The appropriate logic combination is taken care of by the fourth N-FET T4 in each drive path 31, which receives the drive turn-on signal AES at its gate electrode and turns on only when this signal is at H level. Only when all four N-FETs T1–T4 in a drive path 31 are on is the drive path in question turned on and connects the associated output line 40 to the L potential. In this way, the connection device 50 is conditioned for the word line group 60 determined by the input address, in order to be able to activate or reset word lines of the group in question using the signals WTS or WRS associated with them.

Before the signal AES becomes active and after this signal is ended, the P-FETs T5 on the output lines 40 are kept on by the L level of a precharging signal VLS in order to keep the output lines 40 at H potential. The signal VLS is time-controlled such that it changes to H level no later than when the turn-on signal AES becomes active, in order to decouple the output lines 40 from the H potential.

As mentioned above and shown in the drawing, for layout reasons, the drive paths 31 need to be arranged such that their longitudinal extent extends transversely with respect to the direction of the word lines 60. Along their longitudinal extent, therefore, the four transistors T1–T4 need to share a limited amount of space. This presents the integration problems described in detail above, which are solved by designing the decoder circuit in accordance with the invention, as shown in the exemplary embodiment of FIG. 2.

The design and operation of many parts of the inventive decoder circuit 2 shown in FIG. 2 correspond to those of the known decoder circuit 1 shown in FIG. 1 and are denoted by the same reference symbols as in that case. For this reason, these parts will not be described again; only the differences will be discussed in more detail below.

The decoder circuit 2 shown in FIG. 2 differs from the prior art decoder circuit 1 in that each of its drive paths 32 is missing the fourth N-FET T4 that responds to the turn-on signal AES. Instead, the first input decoder 11 is provided with a device 70 that enables the outputs a1 to a8 of the decoder 11 only when the turn-on signal AES appears. This enabling device 70 is shown in FIG. 2 in symbol form as a group of eight switches which are inserted between the eight outputs a1 to a8 of the input decoder 11 and the associated input lines of the coupling network 20. The switches are all controlled by the turn-on signal AES such that they all turn on precisely when this signal is in the active state (H level). This means that an active state (H level) of any one of the outputs of the input decoder 11 cannot be forwarded so long as the turn-on signal AES is not present.

Owing to the fact that the N-FETs T1 in all the drive paths 32 are controlled by the outputs of the first input decoder 11 and only turn on when they receive an H level from any one of these outputs, they also remain off so long as the turn-on signal AES is not present. Only when the signal AES is in the active state can the set of N-FETs T1 selected by an active output of the input decoder 11 turn on. In the decoder circuit 2 shown in FIG. 2, the N-FETs T1 thus perform a dual function: firstly, the partial selection of the drive paths 32 on the basis of the one-of-8 decoding of the input decoder 11 (as in the known decoder circuit 1 shown in FIG. 1), and secondly the logic combination of the drive operation with the drive turn-on signal AES (which, in the prior art decoder circuit, was performed by the fourth N-FET T4—see FIG. 1). The dual function of the N-FETs T1 thus allows the N-FETs T4 to be dispensed with, so that each drive path 32 of the inventive decoder circuit 2 needs to incorporate one N-FET fewer than in the known case. This gives each of the N-FETs in the drive paths 32 more space, so that the N-FETs in each drive path can be provided with a greater channel length and/or with a greater distance from one another, as can clearly be seen in FIG. 2. It is thus also possible, with very tightly packed word lines in a memory matrix, to provide the N-FETs in the transverse drive paths of the output decoder with a sufficient size of channel length and/or with halo implants for optimizing their reverse resistance.

The decoder circuit 2 described above with reference to FIG. 2 is just one exemplary embodiment, and the present invention is not limited to this. This applies both with respect to the type of transistors described and with respect to the selection of the controlling signal levels. Naturally, it is also possible for the number of word lines per word line group 60, that is to say the capability of the subsets to be selected, to be different than four; any number $\geq 1$ is possible. The space available for the longitudinal extent of the drive paths 32 becomes smaller the greater the packing density of the word lines and the lower the capability of the word line subsets 60 used by a respective connection device 50. If that space has very narrow limits, it may be necessary to "stack" two or more respective instances of the N drive paths above one another on the chip. The invention can also be used advantageously with this variant.

The inventive principle of performing the logic combination with the drive turn-on signal on one of the input decoders instead of in the output decoder can be advantageous with any type of multistage 1-out-of-N decoder circuits, simply on account of the smaller number of individual logic combinations required. The invention is thus also not limited to the described use for addressing selection lines for memory access, and to the same extent it is not limited to the use of drive paths in which field effect transistors are used as switches.

In summary, and stated in general terms, the subject matter of the invention is a 1-out-of-N decoder circuit which, to drive a selected one (the selected instance) from a set of N output lines on the basis of an M-bit address and in response to a turn-on signal, contains the following: a number $K \geq 2$ of parallel input decoders, each of which decodes an associated segment of the M-bit address by activating precisely one instance of its outputs; an output decoder which has, for each of the N output lines, a separate drive path having a group of K controllable switches in series between the output line in question and a drive potential, with each switch group in the output decoder being able to be turned on by precisely one associated subset of the input decoder outputs which contains precisely one output from each input decoder; a device which is connected to the outputs of one of the input decoders and responds to the turn-on signal in order to enable these outputs for coupling to the associated switches in the drive paths only during the appearance of the turn-on signal.

I claim:

1. A decoder circuit for driving a selected one of a set of N output lines on the basis of an M-bit address and in response to a turn-on signal, the decoder circuit comprising:

a number $K \geq 2$ of parallel input decoders having a plurality of inputs together receiving an M-bit address, a plurality of input decoder outputs, and each receiving a respectively associated segment of the M-bit address and, for each bit pattern to be expected for the segment, activating precisely one of said outputs uniquely associated with the bit pattern;

an output decoder having, for each of the N output lines, a separate drive path with a plurality of controllable switches having switching paths in series between the respective output line and a drive potential;

a coupling network for coupling each of N different subsets of said input decoder outputs, which respectively contain one output of each of the K input decoders, to the control connections of K instances of said controllable switches in one instance of said N drive paths associated with the subset in question, such that said switches turn on when those instances of the input decoder outputs coupled thereto have been activated; and a combinational logic device connected to all said outputs of one of said input decoders and having an input receiving a turn-on signal and configured to permit said drive paths to be connected through only when the turn-on signal appears, whereby said combinational logic device responds to the turn-on signal by enabling said outputs to be coupled to said control connections of said switches associated with said outputs in the drive paths only during the appearance of the turn-on signal.

2. The decoder circuit according to claim 1 commonly integrated with a memory matrix on a semiconductor chip and forming an address decoder for addressing N subsets of a a plurality of mutually parallel selection lines in the memory matrix, each of the output lines connected to said connection device for an associated subset of said selection lines, and a series circuit comprising said switches being arranged, along a length thereof, in each drive path transversely with respect to the selection lines in the memory matrix.

3. The decoder circuit according to claim 2, wherein said switches in each drive path are field effect transistors having channels forming said switching paths and gate electrodes forming said control connections.

4. The decoder circuit according to claim 3, wherein said field effect transistors forming said switches in said drive paths are optimized by halo implants at respective ends of said channels thereof.

5. The decoder circuit according to claim 2, wherein each of the output lines is connected to said connection device for an associated subset of said word lines in said memory matrix.

6. An integrated circuit, comprising a memory matrix integrated on a semiconductor chip and having selection lines running parallel to one another in a given direction, and a decoder circuit according to claim 1 commonly integrated with said memory matrix on said semiconductor chip and forming an address decoder for addressing N subsets of said selection lines in said memory matrix, each of the output lines connected to said connection device for an associated subset of said selection lines, and a series circuit comprising said switches being arranged, along a length thereof, in each drive path transversely with respect to said given direction of said selection lines.

* * * * *